(12) United States Patent
Liu

(10) Patent No.: US 11,538,885 B2
(45) Date of Patent: Dec. 27, 2022

(54) ARRAY SUBSTRATE AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Jianxin Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 331 days.

(21) Appl. No.: 16/627,374

(22) PCT Filed: Nov. 4, 2019

(86) PCT No.: PCT/CN2019/115393
§ 371 (c)(1),
(2) Date: Dec. 30, 2019

(87) PCT Pub. No.: WO2021/035944
PCT Pub. Date: Mar. 4, 2021

(65) Prior Publication Data
US 2021/0335984 A1   Oct. 28, 2021

(30) Foreign Application Priority Data
Aug. 23, 2019   (CN) .......................... 201910781432.3

(51) Int. Cl.
*H01L 27/32* (2006.01)
*G02F 1/1362* (2006.01)

(52) U.S. Cl.
CPC .... *H01L 27/3276* (2013.01); *G02F 1/136204* (2013.01); *G02F 1/136222* (2021.01); *G02F 1/136286* (2013.01); *H01L 27/322* (2013.01)

(58) Field of Classification Search
CPC .............. H01L 27/3276; H01L 27/322; H01L 27/3241; G02F 1/136204; G02F 1/136222; G02F 1/136286; G02F 2202/22
See application file for complete search history.

(56) References Cited

U.S. PATENT DOCUMENTS 10,912,215 B2 *  2/2021  Lee ................. H05K 1/147
2011/0085336 A1 *  4/2011  Blumel ............... F21V 5/04
362/255

(Continued)

FOREIGN PATENT DOCUMENTS

CN        2606373 Y    3/2004
CN      102945644 A    2/2013
(Continued)

*Primary Examiner* — S M Sohel Imtiaz
(74) *Attorney, Agent, or Firm* — PV IP PC; Wei Te Chung; Ude Lu

(57) ABSTRACT

An array substrate and a display panel are provided. The array substrate has a plurality of first power lines and a plurality of second power lines connecting with power lines within corresponding fan-out areas, respectively. The first power lines and the second power lines are arranged in parallel to each other and staggered within a display area. At least one of the first power lines within an anti-static area connects with one of the second power lines adjacent to the first power line thereby solving the problem of voltage drop and line defects caused by unilateral driving.

18 Claims, 6 Drawing Sheets

(56) References Cited

U.S. PATENT DOCUMENTS

| | | | | |
|---|---|---|---|---|
| 2014/0139413 | A1* | 5/2014 | Kwon | G09G 3/3291 |
| | | | | 345/82 |
| 2017/0061893 | A1* | 3/2017 | Kwon | G09G 3/3266 |
| 2017/0062408 | A1* | 3/2017 | Chung | H01L 27/0296 |
| 2017/0168617 | A1* | 6/2017 | Qu | G06F 3/0445 |
| 2017/0358603 | A1* | 12/2017 | Choi | G09G 3/3275 |
| 2018/0337226 | A1* | 11/2018 | Liu | H01L 27/3276 |
| 2018/0340672 | A1* | 11/2018 | Kim | F21K 9/64 |
| 2020/0075640 | A1* | 3/2020 | Song | H01L 27/285 |
| 2021/0373393 | A1* | 12/2021 | Yang | G02F 1/136222 |

FOREIGN PATENT DOCUMENTS

| | | |
|---|---|---|
| CN | 103022330 A | 4/2013 |
| CN | 203689856 U | 7/2014 |
| CN | 104040740 A | 9/2014 |
| CN | 107180613 A | 9/2017 |
| CN | 107221257 A | 9/2017 |
| CN | 108230913 A | 6/2018 |
| CN | 208689337 U | 4/2019 |
| DE | 20302370 U1 | 5/2003 |
| JP | H07161953 A | 6/1995 |

* cited by examiner

ARRAY SUBSTRATE AND DISPLAY PANEL

FIELD OF INVENTION

The present invention relates to a display technical field, and more particularly, to an array substrate and a display panel.

BACKGROUND OF INVENTION

With the development of display panels towards large sizes and high resolution, the original unilateral driving of the source electrode COF can no longer meet demands, and it needs to be designed to drive the source electrode COF bilaterally. In this design, the voltage drop of the power lines becomes more apparent as it gradually moves away from the source electrode COF, which affects uniformity of luminous brightness.

It is therefore necessary to improve the voltage drop and line defects in the power lines of the current display device.

SUMMARY OF INVENTION

The present invention provides an array substrate and a display panel in order to solve technical problems of voltage drop and line defects existing in power lines of current display devices.

To solve above problems, the present invention provides technical solutions as following:

One embodiment of the present invention provides an array substrate, comprising:

a first fan-out area;

a second fan-out area, wherein the second fan-out area and the first fan-out area are located at two opposite ends of the array substrate;

a plurality of first power lines connecting with the power lines within the first fan-out area; and a plurality of second power lines connecting with the power lines within the second fan-out area;

wherein the first power lines and the second power lines are disposed in parallel to each other and staggered within a display area; and wherein at least one of the first power lines connects with one of the second power lines adjacent to the first power line.

In the array substrate according to one embodiment of the present invention, the array substrate further includes a first anti-static area located between the first fan-out area and the display area, and the first anti-static area has a plurality of first connection lines through which the first power lines connect with the second power lines.

In the array substrate according to one embodiment of the present invention, the first connection lines are formed by patterning a source-drain layer.

In the array substrate according to one embodiment of the present invention, the first anti-static area further has a plurality of second connection lines, and the first power lines connect with the second power lines through the first connection lines and the second connection lines.

In the array substrate according to one embodiment of the present invention, the second connection lines are formed by patterning a gate electrode layer.

In the array substrate according to one embodiment of the present invention, the second connection lines are formed by patterning a pixel electrode layer.

In the array substrate according to one embodiment of the present invention, the first anti-static area further has third connection lines, and the first power lines connect with two of the second power lines adjacent to the first power lines through the third connection lines.

In the array substrate according to one embodiment of the present invention, the third connection lines are formed by patterning a gate electrode layer.

In the array substrate according to one embodiment of the present invention, the third connection lines are formed by patterning a pixel electrode layer.

In the array substrate according to one embodiment of the present invention, the array substrate further includes a second anti-static area located between the second fan-out area and the display area, and the second anti-static area has a plurality of fourth connection lines through which the first power lines connect with the second power lines.

In the array substrate according to one embodiment of the present invention, the fourth connection lines are formed by patterning a source-drain layer.

In the array substrate according to one embodiment of the present invention, the second anti-static area further has a plurality of fifth connection lines; and the first power lines connect with the second power lines through the fourth connection lines and the fifth connection lines.

In the array substrate according to one embodiment of the present invention, the fifth connection lines are formed by patterning a gate electrode layer.

In the array substrate according to one embodiment of the present invention, the fifth connection lines are formed by patterning a pixel electrode layer.

In the array substrate according to one embodiment of the present invention, the second anti-static area further has sixth connection lines through which the first power lines connect with two of the second power lines adjacent to the first power lines.

In the array substrate according to one embodiment of the present invention, the sixth connection lines are formed by patterning a gate electrode layer.

In the array substrate according to one embodiment of the present invention, the sixth connection lines are formed by patterning a pixel electrode layer.

Another embodiment of the present invention provides a display panel which comprises the array substrate provided by one embodiment of the present invention.

In the display panel according to one embodiment of the present invention, the display panel is an organic light emitting diode (OLED) display panel comprising:

a light emitting function layer disposed on the array substrate;

and an encapsulation layer disposed on the light emitting function layer.

In the display panel according to one embodiment of the present invention, the display panel is a liquid crystal display panel comprising:

a color filter substrate disposed opposite to the array substrate;

a liquid crystal layer disposed between the array substrate and the color filter substrate.

The beneficial effects of the present invention are: the present invention provides an array substrate and a display panel, wherein the array substrate comprises: a plurality of first power lines connecting with power lines within a first fan-out area; a plurality of second power lines connecting with power lines within a second fan-out area; wherein the first power lines and the second power lines are disposed in parallel to each other and staggered within a display area; and wherein at least one of the first power lines connects with one of the second power lines adjacent to the first power line. The present invention makes the at least one of the first power lines connect with the second power lines adjacent to the first power line within the first anti-static area and the second anti-static area, thereby solving the serious problem of voltage drop caused by unilateral driving that affects the brightness uniformity of the panel, and also solving the problem of serious line defects caused by laser repair for the short circuit of the power lines.

BRIEF DESCRIPTION OF DRAWINGS

In order to more clearly illustrate the technical solutions in the embodiment or in the present invention, the following drawings, which are intended to be used in the description of the embodiment or of the present invention, will be briefly described. It is understood that the drawings described below are merely some embodiments of the present invention, and it will be possible to those skilled in the art to obtain other drawings according to these drawings without creative efforts.

DETAILED DESCRIPTION OF PREFERRED EMBODIMENTS

Figure 1:
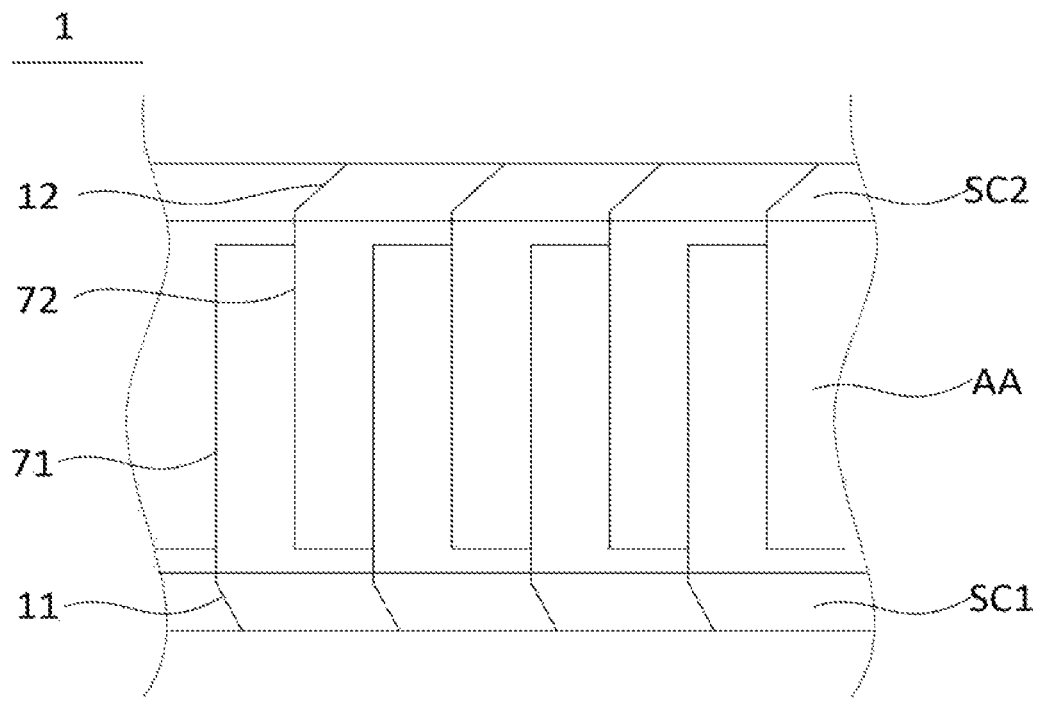
FIG. 1 is a schematic view showing a layout of power lines on an array substrate according to one embodiment of the present invention.

The detailed description of the following embodiments is used for exemplifying the specific embodiments of the present invention by referring to the accompany drawings. Directional terms described by the disclosure, such as upper, lower, front, back, left, right, inner, outer, side etc., are only directions by referring to the accompanying drawings, and thus the directional terms are used to describe and understand the present invention, but the present invention is not limited thereto. In the drawings, like reference numerals designate like elements throughout the specification.

Embodiments provided by the present invention can solve the technical problems of voltage drop and line defects of power lines existing in the current the display device.

In one embodiment, as shown in FIG. 1, a schematic view of an array substrate 1 provided in this embodiment comprises:

a first fan-out area SC1;

a second fan-out area SC2, wherein the second fan-out area SC2 and the first fan-out area SC1 are located at two opposite ends of the array substrate 1;

a plurality of first power lines 71 connecting with the power line 11 within the first fan-out area SC1; and a plurality of second power lines 72 connecting with the power lines 12 within the second fan-out area SC2;

wherein the first power lines 71 and the second power lines 72 are disposed in parallel to each other and staggered within a display area AA; and wherein at least one of the first power lines 71 connects with one of the second power lines 72 adjacent to the first power line 71.

The present invention provides an array substrate comprising: a plurality of first power lines connecting with power lines within a first fan-out area; a plurality of second power lines connecting with power lines within a second fan-out area; wherein the first power lines and the second power lines are disposed in parallel to each other and staggered within a display area; and wherein at least one of the first power lines connects with one of the second power lines adjacent to the first power line. The present invention makes the at least one of the first power lines connect with the second power lines adjacent to the first power line within the first anti-static area and the second anti-static area, thereby solving the serious problem of voltage drop and line defects of the first power lines and the second power lines caused by unilateral driving.

Figure 2:
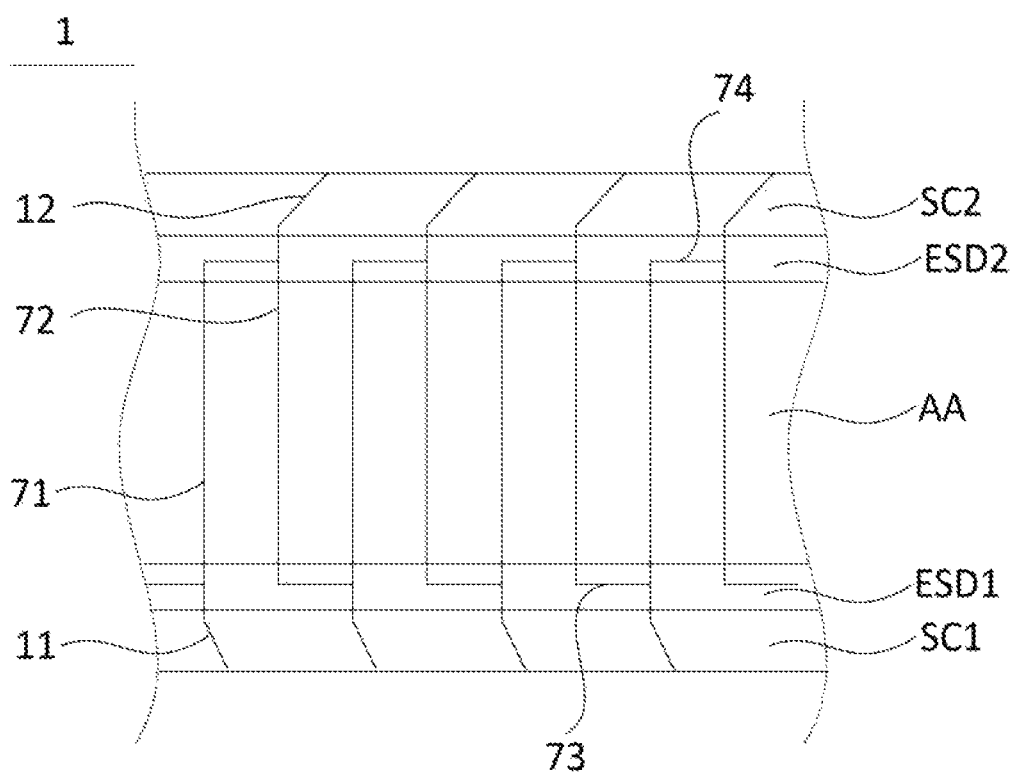
FIG. 2 is a schematic view showing a connection of power lines within an anti-static area on an array substrate according to one embodiment of the present invention.

In one embodiment, as shown in FIG. 2, the array substrate 1 further comprises a first anti-static area ESD1 located between the first fan-out area SC1 and the display area AA, and the first anti-static area ESD1 has a plurality of first connection lines 73 through which the first power lines 71 connect with the second power lines 72.

The anti-static area uses electrostatic discharge components composed of diodes connected in reverse to protect the static electricity. Because the display device will accumulate static electricity during the preparation process, the static electricity is released by setting the anti-static area to prevent static electricity damage on the array substrate.

Figure 3:
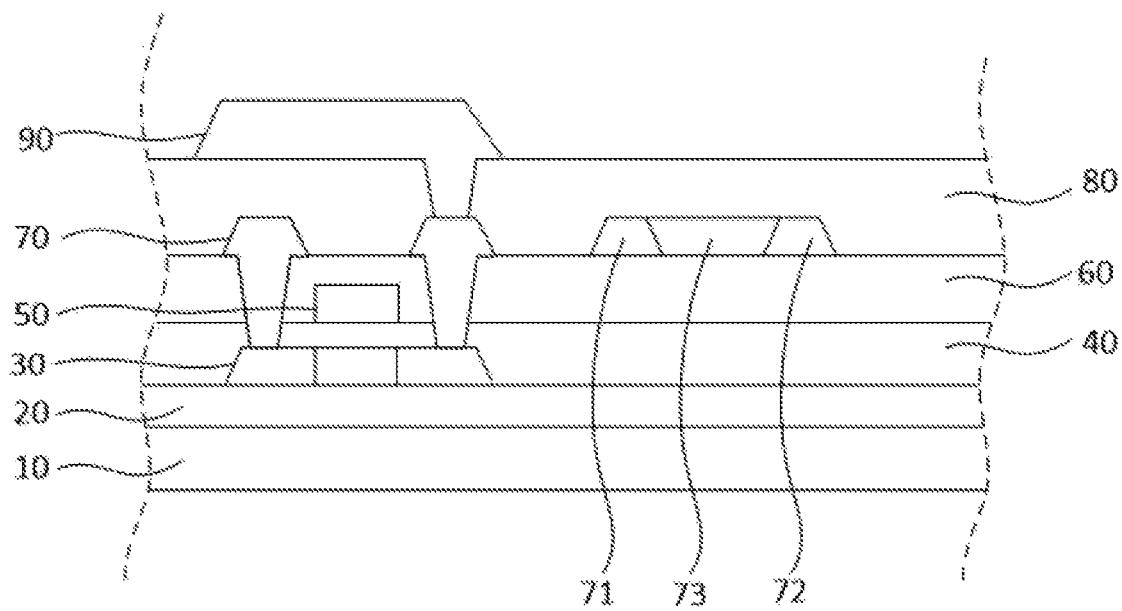
FIG. 3 is a first connection of power lines within a first anti-static area according to one embodiment of the present invention.

In one embodiment, as shown in FIG. 3, a thin film transistor comprises:

a base 10;

a buffer layer 20 disposed on the base 10;

an active layer 30 disposed on the buffer layer 20;

a gate insulating layer 40 disposed on the active layer 30 and the buffer layer 20;

a gate electrode layer 50 disposed on the gate insulating layer 40;

an interlayer insulating layer 60 disposed on the gate electrode layer 50 and the gate insulating layer 40;

a source-drain layer 70 disposed on the interlayer insulating layer 60;

a planarization layer 80 disposed on the source-drain layer 70 and the interlayer insulating layer 60; and a pixel electrode layer 90 disposed on the planarization layer 80.

In one embodiment, as shown in FIG. 3, in addition to a source electrode and a drain electrode are formed by patterning the source-drain layer through the exposing, developing and etching method, the source-drain layer further has the first connection lines 73; the first connection lines 73, the first power lines 71 and the second power lines 72 are formed by same step of the exposing, developing and etching method; the first power lines 71 connect with the second power lines 72 through the first connection lines 73.

Figure 4:
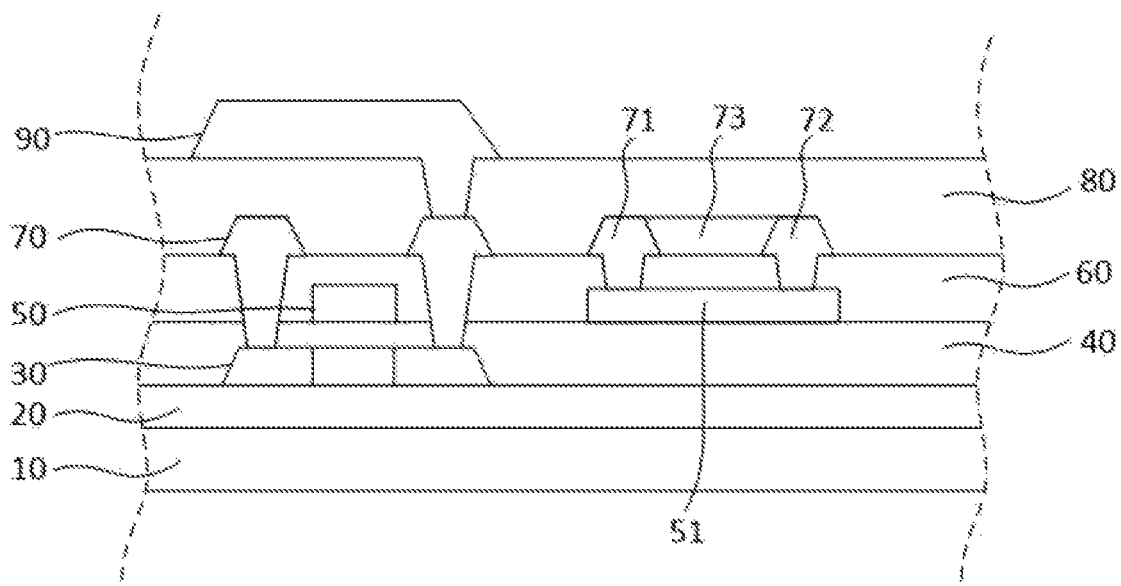
FIG. 4 is a second connection of power lines within a first anti-static area according to one embodiment of the present invention.

In one embodiment, as shown in FIG. 2 and FIG. 4, the first anti-static area ESD1 further has a plurality of second connection lines 51, and the first power lines 71 connect with the second power lines 72 through the first connection lines 73 and the second connection lines 51.

In one embodiment, as shown in FIG. 4, the second connection lines 51 are formed by patterning the gate electrode layer 50; while the gate electrode is formed by patterning the gate electrode layer 50 through the exposing, developing and etching method, the second connection lines 51 are also formed from the gate electrode layer 50. The second connection lines 51 are located at a layer different from where the first power lines 71 and the second power lines 72 are located at, and therefore through vias are necessary for their connection.

In one embodiment, as shown in FIG. 4, the first through via and the second through via are formed by patterning the interlayer insulating layer 60. The first through via is used for connecting the source electrode and the drain electrode of the source-drain layer 70 with a doping area of the active layer 30. The second through via is used for connecting the first power lines 71 and the second power lines 72 with the second connection lines 51.

In one embodiment, in addition to the active layer 30 is patterned to form the doping area, a channel region is also formed. The doping area is formed by performing an ion doping process to the channel region shielded by the gate electrode layer 50 served as a mask.

Figure 5:
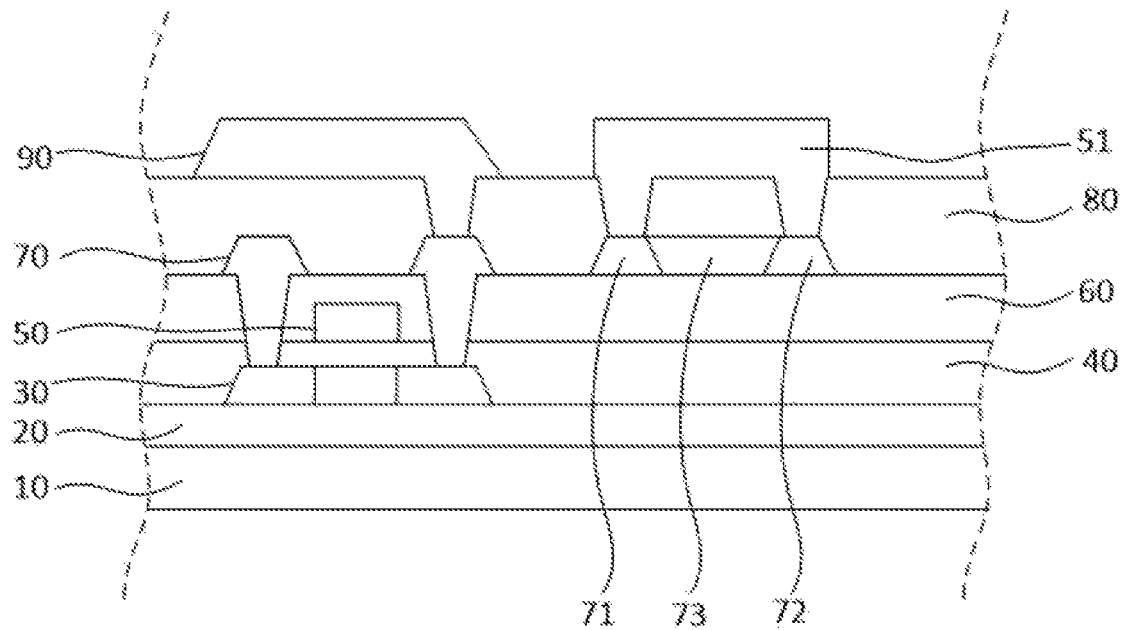
FIG. 5 is a third connection of power lines within a first anti-static area according to one embodiment of the present invention.

In one embodiment, as shown in FIG. 5, the second connection lines 51 are formed by patterning the pixel electrode layer 90. The pixel electrode layer 90 is patterned to form the pixel electrode and the second connection lines 51 at the same time. The second connection lines 51 are located at a layer different from where the first power lines 71 and the second power lines 72 located at, and therefore the through vias are necessary for their connection.

In one embodiment, the material of the pixel electrode layer can be a transparent electrode material or a metallic material.

In one embodiment, as shown in FIG. 5, the planarization layer 80 is patterned to form a third through via and a fourth through via. The third through via is used for connecting the pixel electrode with the drain electrode.

The fourth through via is used for connecting the first power lines 71 and the second power lines 72 with the second connection lines 51.

Figure 6:
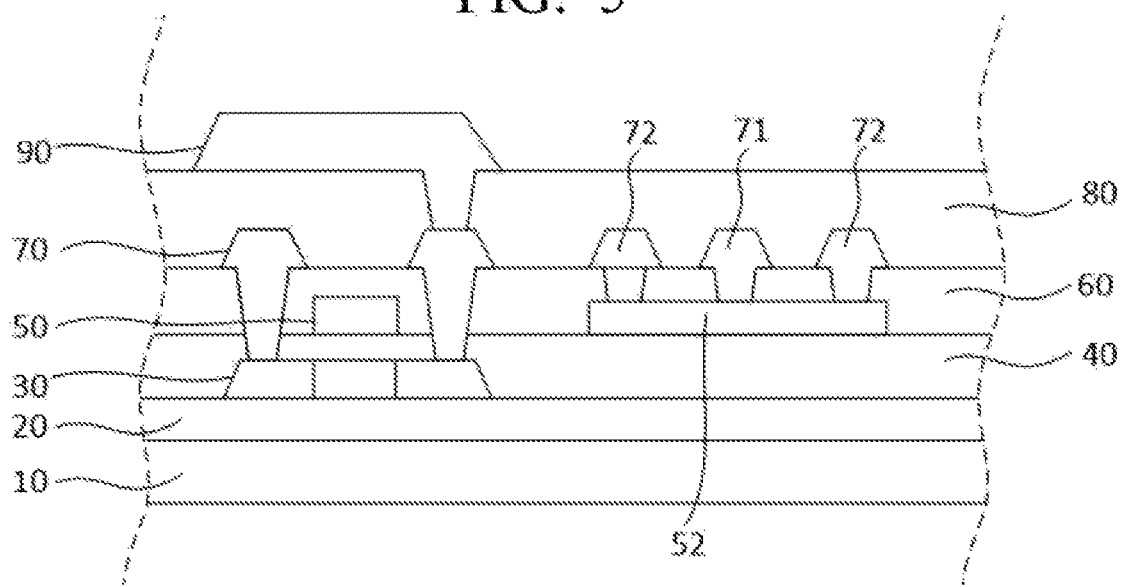
FIG. 6 is a fourth connection of power lines within a first anti-static area according to one embodiment of the present invention.

In one embodiment, as shown in FIG. 6, the first anti-static area ESD1 further has third connection lines 52, and the first power lines 71 connect with two of the second power lines 72 adjacent to the first power lines through the third connection lines 52.

In one embodiment, the third connection lines 52 are formed by patterning a gate electrode layer 50. While the gate electrode layer 50 is patterned to form a gate electrode through the exposing, developing, and etching process, the third connection lines 52 are formed. The third connection lines 52 is located at a layer different from where the first power lines 71 and the second power lines 72 located at, and therefore the through vias are necessary for their connection.

In one embodiment, the interlayer insulating layer 60 is patterned to form the first through via and a fifth through via.

The first through via is used for connecting the source electrode and the drain electrode of the source-drain layer 70 with the doping area of the active layers 30. The fifth through via is used for connecting the first power lines 71 and two of the second power lines 72 adjacent to the first power lines with the third connection lines 52.

Figure 7:
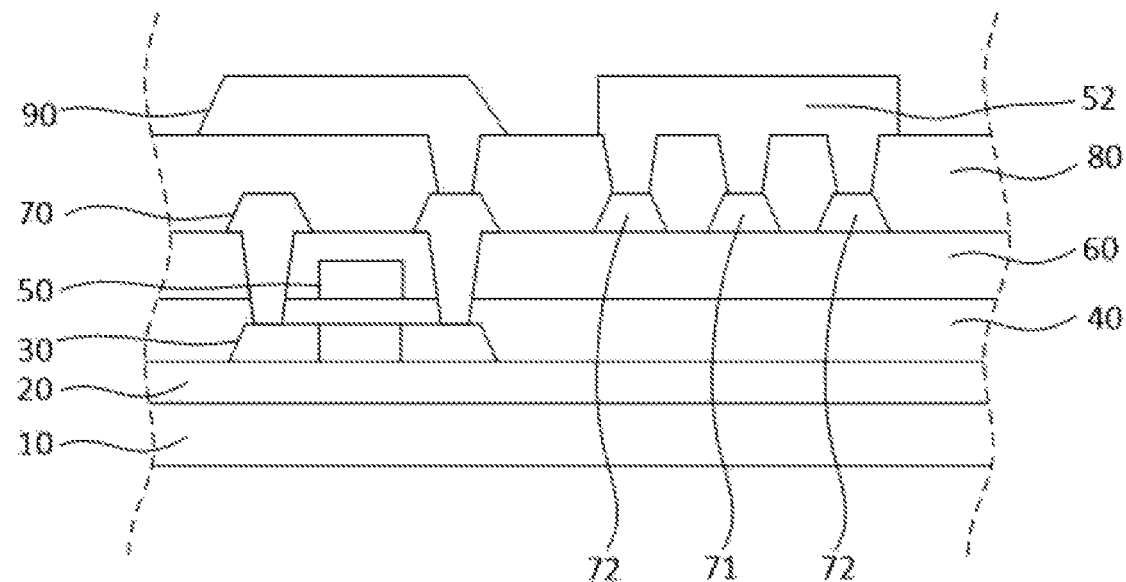
FIG. 7 is a fifth connection of power lines within a first anti-static area according to one embodiment of the present invention.

In one embodiment, as shown in FIG. 7, the third connection lines 52 are formed by patterning the pixel electrode layer 90. While the pixel electrode layer 90 is patterned to form the pixel electrode, the third connection lines 52 are formed. The third connection lines 52 are located at a layer different where the first power lines 71 and the second power lines 72 are located at, and therefore the through vias are necessary for their connection.

In one embodiment, the planarization layer 80 is patterned to form the third through via and a sixth through via. The third through via is used for connecting the pixel electrode with the drain electrode. The sixth through via is used for connecting the first power lines 71 and two of the second power lines adjacent to the first power lines with the third connection lines 52.

In one embodiment, as shown in FIG. 2, the array substrate 1 further comprises the second anti-static area ESD2 located between the second fan-out area SC2 and the display area AA. The second anti-static area ESD2 has a plurality of fourth connection lines 74 through which the first power lines 71 connect with the second power lines 72.

In one embodiment, the fourth connection lines are formed from at least one layer of the gate electrode layer, the source-drain layer, and the pixel electrode layer. The specific forming method is referred to the method for forming the first connection lines, the second connection lines, and the third connection lines of the above first anti-static area that is not repeated here.

Figure 8:
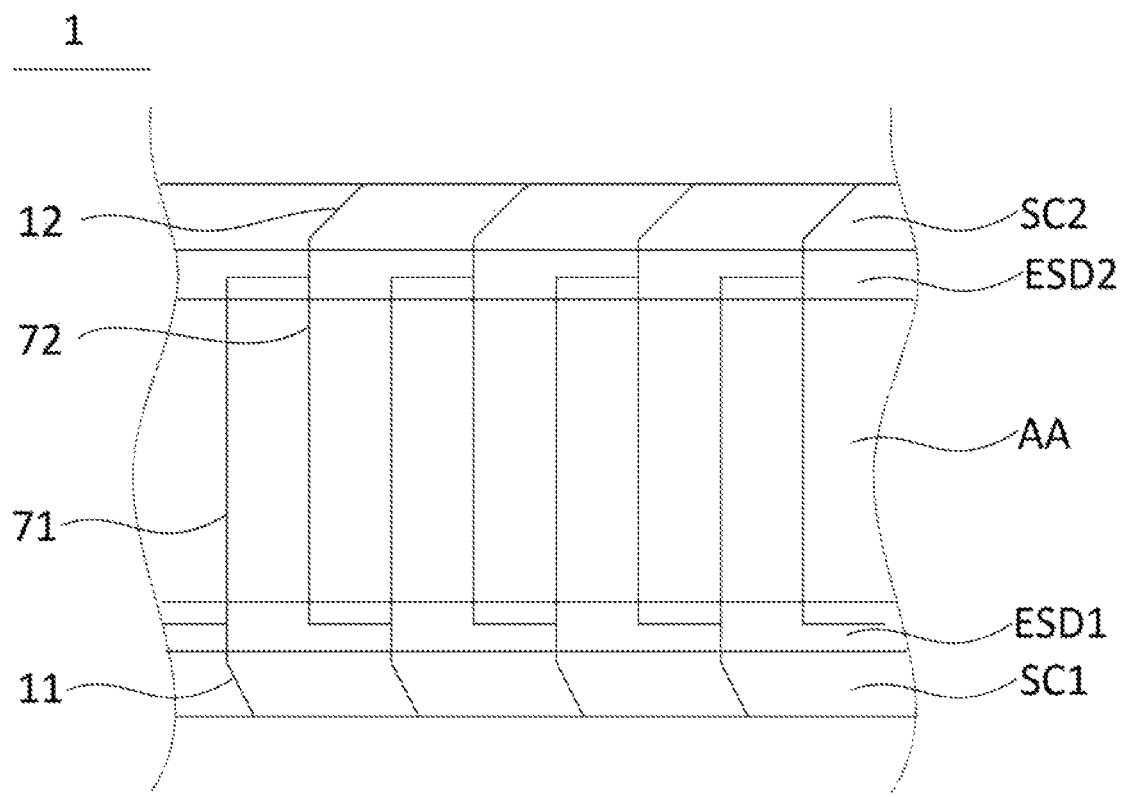
FIG. 8 is a schematic view showing a layout of power lines on an array substrate of an organic light emitting diode (OLED) display panel according to one embodiment of the present invention.

In one embodiment, the present embodiment provides an organic light emitting diode (OLED) display panel, comprising:
  any array substrate of the abovementioned embodiment;
  a light emitting function layer formed on the array substrate; and
  an encapsulation layer formed on the light emitting function layer;
  wherein the array substrate 1 as shown in FIG. 8 includes:
  a first fan-out area SC1;
  a second fan-out area SC2, wherein the second fan-out area SC2 and the first fan-out area SC1 are located at two opposite ends of the array substrate 1;
  a plurality of first power lines 71 connecting with the power lines 11 within the first fan-out area SC1; and
  a plurality of second power lines 72 connecting with the power lines 12 within the second fan-out area SC2;
  wherein the first power lines 71 and the second power lines 72 are disposed in parallel to each other and staggered within a display area AA;
  a first anti-static area ESD1 located between the first fan-out area SC1 and the display area AA;
  a second anti-static area ESD2 located between the second fan-out area SC2 and the display area AA;
  wherein the first power lines 71 and the adjacent second power lines 72 are connected through the connection lines formed by the first anti-static area ESD1 and the second anti-static area ESD2.

In one embodiment, the first anti-static area has fifth connection lines and the second anti-static area has sixth connection lines.

In one embodiment, the fifth connection lines are formed by patterning a source-drain layer of the first anti-static area, and the first power lines connect with the adjacent second power lines through the fifth connection lines.

In one embodiment, the sixth connection lines are formed by patterning the gate electrode layer of the second anti-static area; the first power lines and the adjacent two of the second power lines connect with the sixth connection lines through a through via formed from the interlayer insulating layer of the second anti-static area.

In one embodiment, the sixth connection lines are formed by patterning the pixel electrode layer of the second anti-static area; and the first power lines and two of the second power lines adjacent to the first power lines connect with the sixth connection lines through the through via formed from the planarization layer of the second anti-static area.

In one embodiment, the first anti-static area has seventh connection lines and eighth connection lines. The second anti-static area has ninth connection lines.

In one embodiment, the seventh connection lines are formed by patterning the source-drain layer within the first anti-static area. The first power lines connect with the second power lines adjacent to the first power lines through the fifth connection lines.

In one embodiment, the eighth connection lines are formed by patterning the gate electrode layer within the first anti-static area; the first power lines and the adjacent second power lines connect with the eighth connection lines through the through via formed from the interlayer insulating layer within the first anti-static area.

In one embodiment, the eighth connection lines are formed by patterning the pixel electrode layer within the first anti-static area; the first power lines and the adjacent second power lines connect with the eighth connection lines through the through via formed from the planarization layer within the first anti-static area.

In one embodiment, the ninth connection lines are formed by patterning the source-drain layer within the second anti-static area, and the first power lines connect with the second power lines adjacent to the first power lines through the ninth connection lines.

Figure 9:
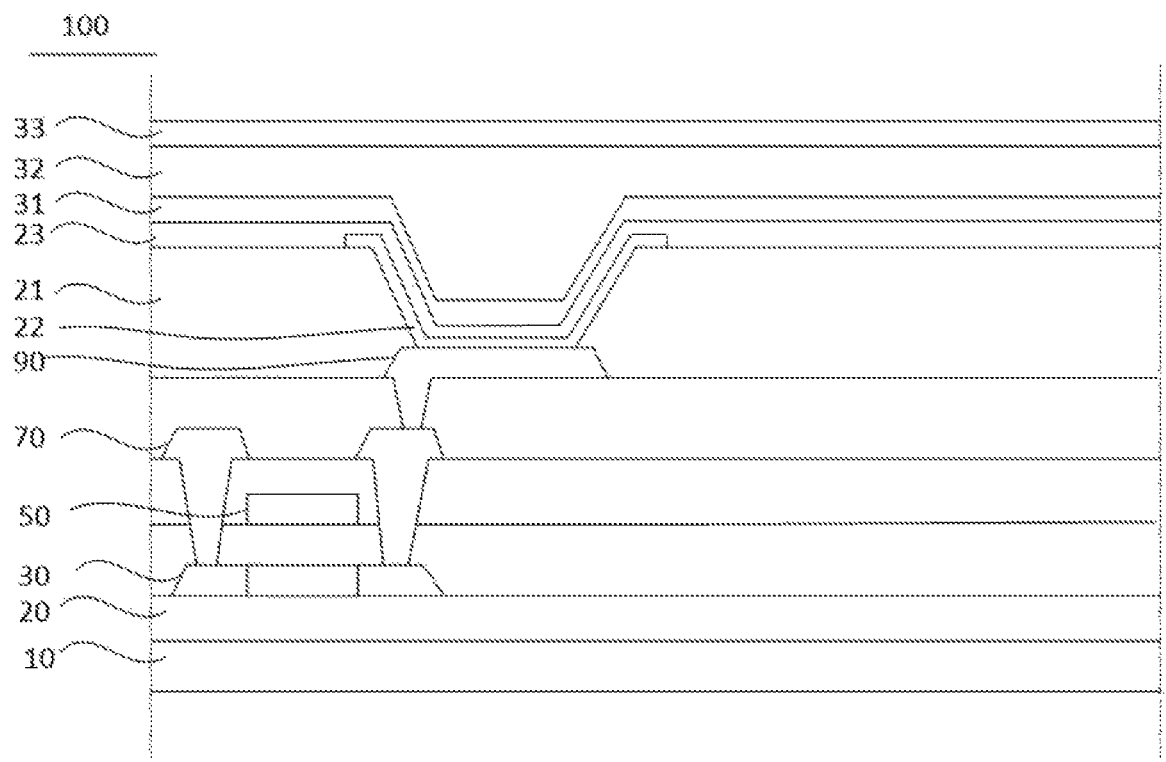
FIG. 9 is a schematic view showing a film structure of an OLED display according to one embodiment of the present invention.

In one embodiment, as shown in FIG. 9, a schematic view shows the film structure of the OLED display panel that comprises the array substrate, the light emitting function layer, and the encapsulation layer. The array substrate comprises a base 10, a buffer layer 20, an active layer 30, a gate electrode layer 50, a source-drain layer 70, a pixel electrode layer 90, and insulating layers between each of the metal circuit layers. The light emitting function layer comprises a light emitting material layer 22 disposed on the pixel electrode layer 90, a cathode layer 23 disposed on the light emitting material layer 22, and a pixel definition layer 22 disposed on the pixel electrode layer 90. The encapsulation layer includes a first inorganic encapsulation layer 31, an organic encapsulation layer 32, and a second inorganic encapsulation layer 33.

In one embodiment, the first inorganic encapsulation layer 31 and the second inorganic encapsulation layer 33 both can be deposited on the light emitting function layer by chemical vapor deposition (CVD), physical vapor deposition (PVD), or atomic layer deposition (ALD).

In one embodiment, the first inorganic encapsulation layer 31 and the second inorganic encapsulation layer 33 can be one of silicon oxide, silicon nitride, and silicon oxynitride.

In one embodiment, the organic encapsulation layer 32 can be applied on the first inorganic encapsulation layer 31 by one of inkjet printing, spraying, and coating.

In one embodiment, the material of the organic encapsulation layer 32 can be one of an epoxy based material and an acrylic based material.

In one embodiment, a liquid crystal display panel is provided with:

any of the array substrate of abovementioned embodiments;

a color filter substrate disposed on the array substrate;

a liquid crystal layer disposed between the array substrate and the color filter substrate.

It is characterized that the array substrate as shown in FIG. 2 comprises:

a first fan-out area SC1;

a second fan-out area SC2, wherein the second fan-out area and the first fan-out area are located at two opposite ends of the array substrate 1;

a plurality of first power lines 71 connecting with the power lines 11 within the first fan-out area SC1; and a plurality of second power lines 72 connecting with the power lines 12 within the second fan-out area SC2;

wherein the first power lines 71 and the second power lines 72 are disposed in parallel to each other and staggered within a display area AA;

a first anti-static area ESD1 located between the first fan-out area SC1 and the display area AA;

a second anti-static area ESD2 located between the second fan-out area SC2 and the display area AA;

wherein the first power lines 71 and the adjacent second power lines 72 connect with each other through the connection lines 73/74 formed from the first anti-static area ESD1 and the second anti-static area ESD2.

In one embodiment, a display device is provided with:

any one of the display panel of the abovementioned embodiments and a driving circuit disposed surrounding the display panel.

Figure 10:
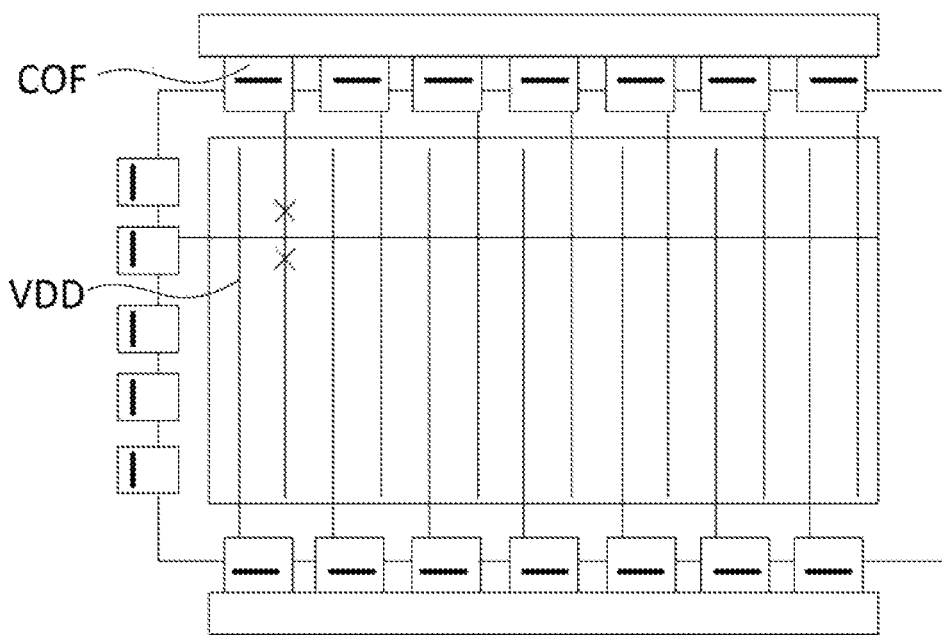
FIG. 10 is a schematic view showing a layout of power lines in a display device according to current technology.

With the rapid development of display technology, OLED display devices in the prior art have become the new favorite of current flat panel display devices. OLED display devices have many advantages such as self-illumination, fast response and wide viewing angle, so it has been widely used. The brightness uniformity is an important factor affecting the display effect of the display screen. There are many factors that affect the brightness uniformity of the display device, such as the common voltage drop (IR Drop). As shown in FIG. 10, it is a schematic circuit design for power line (VDD) of an OLED display device. When the resolution of the OLED panel is improved to a certain degree, due to the limitation of the current binding process, the power lines cannot be driven from one side, and must be driven by means of bilaterally bound source electrode COF. In this design, the voltage drop of the power lines becomes more apparent as it gradually moves away from the source electrode COF, which affects the uniformity of the luminous brightness. When the power lines and the horizontal gate lines are short-circuited, after cutting off the power lines by a repair laser, there will be a problem that the side of the power lines far away from the COF terminal cannot provide voltage that cause serious line defects. At present, in order to solve this line defect, a repair design of rectangle shape is often used, but this design will affect a certain degree of the aperture ratio.

In one embodiment, an array substrate of a display device provided by one embodiment of the present invention, as shown in FIG. 2, includes:

a first fan-out area SC1;

a second fan-out area SC2, wherein the second fan-out area and the first fan-out area SC1 are located at two opposite ends of the array substrate 1;

a plurality of first power lines 71 connecting with the power lines 11 within the first fan-out area SC1;

a plurality of second power lines 72 connecting with the power lines 12 within the second fan-out area SC2;

wherein the first power lines 71 and the second power lines 72 are disposed in parallel to each other and staggered within a display area AA;

a first anti-static area ESD1 located between the first fan-out area and the display area;

second anti-static area located between the second fan-out area and the display area;

wherein the first power lines 71 and the adjacent second power lines 72 connect with each other through the connection lines 73/74 formed from the first anti-static area ESD1 and the second anti-static area ESD2.

Figure 11:
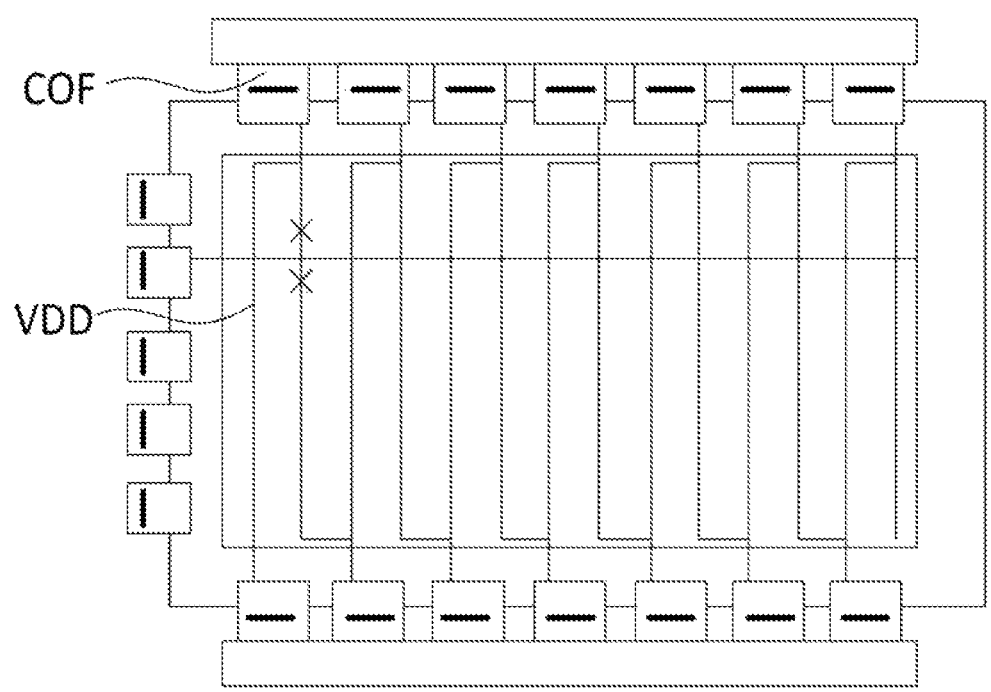
FIG. 11 is a schematic view showing a layout of power lines of a display device according to one embodiment of the present invention.

In one embodiment, the display device provided by the present invention as shown in FIG. 11 has power lines (VDD) arranged into bilateral binding source electrode COF. In the first anti-static area, the first power lines and the adjacent second power lines are connected with each other. In the second anti-static area, the second power lines and the adjacent first power lines are connected with each other. The display device is produced as shown in the figure. The first power lines and the second power lines of the display device both have voltages at two ends thereby solving the problem of voltage drop caused by unilateral driving of the power lines. Also, when a short circuit occurs between the power lines and the horizontal gate lines, a laser repair is used for cutting off the shorted power line. One end of the cut off power line continues to provide voltages through the original corresponding source electrode COF, and the other end has an adjacent power line to provide voltages, thereby solving the problem of the line defects that the power line far away from the source electrode COF after cutting off the shorted power line by the laser repair cannot provide driving voltages in the current technology.

It can be understood according to above embodiments that:

The present invention provides an array substrate, a display panel and a display device, wherein the array substrate comprises: a plurality of first power lines connecting with the power lines within the first fan-out area; a plurality of second power lines connecting with the power lines within the second fan-out area; the first power lines and the second power lines are disposed in parallel to each other and staggered within a display area; and wherein at least one of the first power lines connects with one of the second power lines adjacent to the first power lines. In the present invention, at least one of the first power lines and the second power lines adjacent to the at least one of the first power lines are connected within the first anti-static area and the second anti-static area to solve the serious problem of voltage drop of the power lines caused by unilateral driving that affects the brightness uniformity of the panel, and also, when the power lines and the horizontal lines are short-circuited, the serious line defects during repair is improved, the repair success rate is improved, and the yield of large-size panels can be greatly improved.

In summary, although the present invention has been described with preferred embodiments thereof, the present invention is not limited thereto. It is understood that many changes and modifications to the described embodiments can be carried out by the skilled person in the art without departing from the scope and the spirit of the invention that is intended to be limited only by the appended claims.

What is claimed is:

1. An array substrate, comprising: a first fan-out area; a second fan-out area, wherein the second fan-out area and the first fan-out area are located at two opposite ends of the array substrate; a plurality of first power lines connecting with a power line within the first fan-out area; and a plurality of second power lines connecting with the power line within the second fan-out area; wherein the first power lines and the second power lines are disposed in parallel to each other and staggered within a display area; and wherein at least one of the first power lines connects with one of the second power lines adjacent to the first power lines; wherein the array substrate further includes a first anti-static area located between the first fan-out area and the display area, and the first anti-static area has a plurality of first connection lines through which the first power lines connect with the second power lines; wherein the array substrate further includes a second anti-static area located between the second fan-out area and the display area, and the second anti-static area has a plurality of fourth connection lines through which the first power lines connect with the second power lines; wherein each of the first power lines except for a first one of the first power lines connects with an adjacent one of the second power lines through one of the first connection lines within the first anti-static area and connects with another adjacent one of the second power lines through one of the fourth connection lines within the second anti-static area; wherein each of the second power lines except for a last one of the second power lines connects with an adjacent one of the first power lines through one of the first connection lines within the first anti-static area and connects with another adjacent one of the first power lines through one of the fourth connection lines within the second anti-static area.

2. The array substrate according to claim 1, wherein the first connection lines are formed by patterning a source-drain layer.

3. The array substrate according to claim 1, wherein the first anti-static area further has a plurality of second connection lines, and the first power lines connect with the second power lines through the first connection lines and the second connection lines.

4. The array substrate according to claim 3, wherein the second connection lines are formed by patterning a gate electrode layer.

5. The array substrate according to claim 3, wherein the second connection lines are formed by patterning a pixel electrode layer.

6. The array substrate according to claim 1, wherein the first anti-static area further has third connection lines, and the first power lines connect with two of the second power lines adjacent to the first power lines through the third connection lines.

7. The array substrate according to claim 6, wherein the third connection lines are formed by patterning a gate electrode layer.

8. The array substrate according to claim 6, wherein the third connection lines are formed by patterning a pixel electrode layer.

9. The array substrate according to claim 1, wherein the fourth connection lines are formed by patterning a source-drain layer.

10. The array substrate according to claim 1, wherein the second anti-static area further has a plurality of fifth connection lines; and the first power lines connect with the second power lines through the fourth connection lines and the fifth connection lines.

11. The array substrate according to claim 10, wherein the fifth connection lines are formed by patterning a gate electrode layer.

12. The array substrate according to claim 10, wherein the fifth connection lines are formed by patterning a pixel electrode layer.

13. The array substrate according to claim 1, wherein the second anti-static area further has sixth connection lines through which the first power lines connect with two of the second power lines adjacent to the first power lines.

14. The array substrate according to claim 13, wherein the sixth connection lines are formed by patterning a gate electrode layer.

15. The array substrate according to claim 13, wherein the sixth connection lines are formed by patterning a pixel electrode layer.

16. A display panel, comprising an array substrate according to claim 1.

17. The display panel according to claim 16, wherein the display panel is an organic light emitting diode (OLED) display panel comprising:
   a light emitting function layer disposed on the array substrate; and
   an encapsulation layer disposed on the light emitting function layer.

18. The display panel according to claim 16, wherein the display panel is a liquid crystal display panel comprising:
   a color filter substrate disposed opposite to the array substrate;
   a liquid crystal layer disposed between the array substrate and the color filter substrate.

* * * * *